(12) United States Patent
Friend et al.

(10) Patent No.: US 6,218,977 B1
(45) Date of Patent: Apr. 17, 2001

(54) METHODS AND APPARATUS FOR DISTRIBUTING MISMATCHED ERROR ASSOCIATED WITH DATA CONVERTER ELEMENTS

(75) Inventors: Brian W. Friend, Carlsbad; Daniel L. Essig, La Jolla; Stelian Mocanita, San Diego, all of CA (US)

(73) Assignee: Conexant Systems, Inc., Newport Beach, CA (US)

( * ) Notice: Subject to any disclaimer, the term of this patent is extended or adjusted under 35 U.S.C. 154(b) by 0 days.

(21) Appl. No.: 09/160,735

(22) Filed: Sep. 25, 1998

(51) Int. Cl.$^7$ .................................................... H03M 1/34
(52) U.S. Cl. ............................................. 341/163; 341/148
(58) Field of Search ................................ 341/150, 155, 341/144, 143, 159, 145, 118

(56) References Cited

U.S. PATENT DOCUMENTS

| | | | | |
|---|---|---|---|---|
| 4,935,741 | * | 6/1990 | Reich | 341/150 |
| 5,029,305 | * | 7/1991 | Richardson | 341/159 |
| 5,221,926 | | 6/1993 | Jackson | 341/118 |
| 5,404,142 | | 4/1995 | Adams et al. | 341/144 |
| 5,406,263 | * | 4/1995 | Leung | 341/143 |
| 5,760,726 | * | 6/1998 | Koifman et al. | 341/145 |
| 5,995,028 | * | 11/1999 | Tai | 341/100 |

OTHER PUBLICATIONS

Schreier, R., et al., "Noise–Shaped Multi–Bit D/A Converter Employing Unit Elements", Jul. 17, 1995, pp. 1–8.

Baird, Rex T., et al., "Linearity Enhancement of Multibit Delta Sigma A/D and D/A Converters Using Data Weighted Averaging", IEEE Transactions On Circuits And Systems–II: Analog And Digital Processing, vol. 42, No. 12, Dec. 1995, pp. 753–762.

Galton, Ian, "Spectral Shaping of Circuit Errors in Digital–to–Analog Converters", IEEE Transactions on Circuits and Systems II: Analog and Digital Signal Processing, Dec. 18, 1995, pp. 1–19.

Nys, O.J.A.P., et al., "An Analysis of Dynamic Element Matching Techniques in Sigma–Delta Modulation", IEEE, 1996, pp. 231–234.

Henderson, R.K., et al., "Dynamic Element Matching Techniques With Arbitrary Noise Shaping Function", IEEE, 1996, pp. 293–296.

(List continued on next page.)

Primary Examiner—Peguy Jeanpierre
(74) Attorney, Agent, or Firm—Snell & Wilmer L.L.P.

(57) ABSTRACT

A circuit for implementing a first order noise shaping apparatus for use in data converters employing thermometer-code based elements is disclosed. Raw thermometer code is rotated by up to four columns of shifters such that the code is rotated up to 15 positions. In this manner, the elements of the data converter may equally participate in the conversion process, thereby minimizing the effects of mismatched elements in a data converter by distributing errors due to mismatched elements. Such a process may be used in digital to analog converters and analog to digital converters such that a suitable data weighted algorithm can be used.

17 Claims, 7 Drawing Sheets

OTHER PUBLICATIONS

Lin, Haiqing, et al., "Multi–Bit DAC with Noise–Shaped Element Mismatch", IEEE, 1996, pp. 235–238.

Nys, Olivier, et al., "A 19–Bit Low–Power Multibit Sigma–Delta ADC Based on Data Weighted Averaging", IEEE Journal of Solid–State Circuits, vol. 32, No. 7, Jul. 1997, pp. 933–941.

Williams, L., III, "An Audio DAC with 90dB Linearity using MOS to Metal–Metal Charge Transfer", IEEE/1998 ISSCC Slide Supplement, pp. 44–45.

Fujimori, I., et al., "A 1.5V 4.1mW Dual–Channel Audio Delta–Sigma D/A Converter", IEEE/1998 ISSCC Slide Supplement, pp. 46–47.

Adams, R., et al., "A 113dB SNR Oversampling DAC with Segmented Noise–Shaped Scrambling", IEEE/1998 ISSCC Slide Supplement, pp. 48–49.

Yasuda, A., et al., "A 100kHz, 9.6mW Multi–bit Delta–Sigma DAC and ADC using Noise Shaping Dynamic Elements Matching With a Tree Structure", IEEE/1998 ISSCC Slide Supplement, pp. 50–51.

* cited by examiner

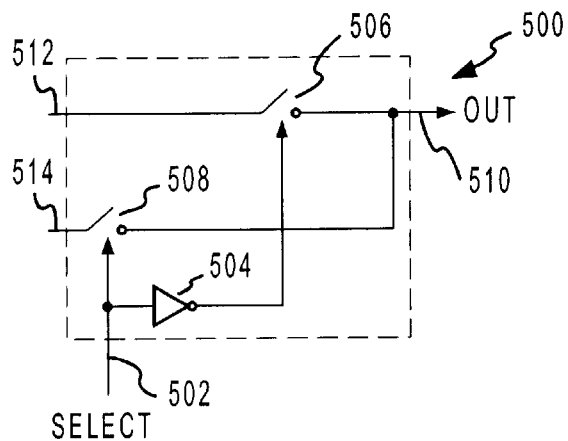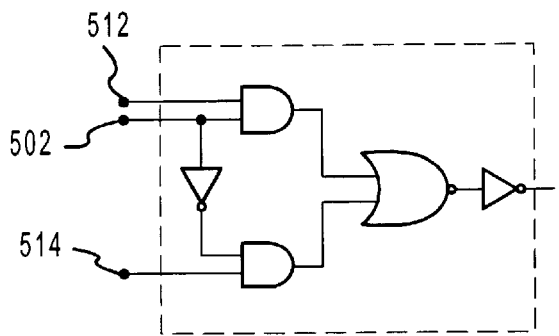
FIG.4a           FIG.4b
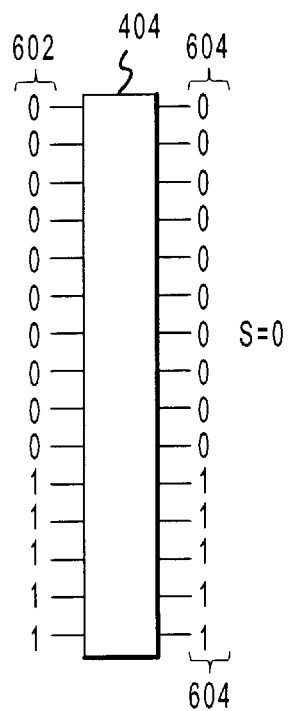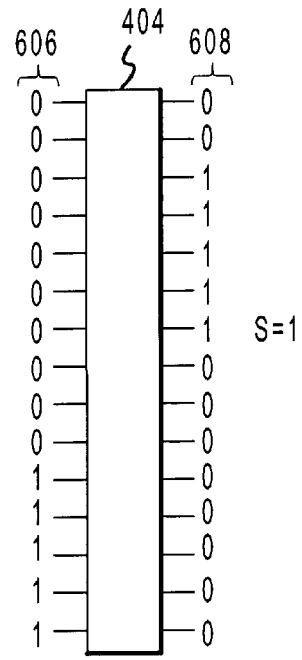
FIG.5a           FIG.5b

METHODS AND APPARATUS FOR DISTRIBUTING MISMATCHED ERROR ASSOCIATED WITH DATA CONVERTER ELEMENTS

BACKGROUND OF THE INVENTION

1. Technical Field

The present invention relates, generally, to a technique for noise shaping the error which results from imperfectly matched DAC elements and, more particularly, to a circuit arrangement for implementing a data weighted, noise shaping algorithm.

2. Background Art and Technical Problems

Currently known multi-bit data convertors employ discrete data elements, including capacitors, resistors, current sources, and the like, for converting electrical signals from analog to digital form and vice versa. For example, in a typical digital-to-analog converter (DAC), a bank of capacitors is configured such that a selected number of the capacitors release their electrical energy into a summing junction that produces an analog output signal equivalent to the digital input.

In an analog-to-digital convertor (ADC), on the other hand, a plurality of comparators are combined with a voltage divider network such that each comparator compares the same reference voltage to an incrementally higher voltage level associated with the incoming analog signal. A common clock triggers the output of the comparators, such that each comparator generates a high logic (1) or a low logic (0) level with the parallel output of the comparators representing a digital "thermometer code" indicative of the incoming analog voltage level. This thermometer code may then be digitally processed to generate an n-bit digital word representing the converted analog signal.

In both the DAC and ADC implementations, each discrete data convertor element (resistor, capacitor, or the like) is modeled as being identical to every other element. However, those skilled in the art will appreciate that some degree of variation inevitably exists among identically modeled elements due to, for example, manufacturing variations, imperfections in the materials used to fabricate the elements, drift in the electrical characteristics of the elements over time, or other variations due to changes in temperature, humidity, degradation, or the like. Although the absolute error from one element to another is generally controllable to within 0.1%, the cumulative effect of the mismatched elements can be substantial and may be exacerbated in certain data critical applications.

Presently known techniques for reconciling mismatch errors are unsatisfactory. For example, while precise laser trimming and other "matching" techniques have been proposed, the cost is high and thus undesirable in the context of a low-cost semiconductor environment. Moreover, although calibration and recalibration techniques have been proposed, this requires additional processing power, increases complexity, and may also require tuning the discrete elements in the field, a solution which is rarely practical.

More recently, others have proposed the technique of algorithmically manipulating data convertor unit elements to provide a noise shaping of the mismatch associated with these elements. Such techniques are particularly attractive in that prior knowledge of the error magnitudes are not required. See, for example, Jackson, U.S. Pat. No. 5,221,926, issued Jun. 22, 1993 and entitled "Circuit and Method for Canceling Non-Linearity Error Associated With Component Value Mismatches in a Data Converter"; and Lin, et al, "Multi-Bit DAC With Noise-Shaped Element Mismatched", IEEE Transactions of Circuits and Systems, dated 1996. The entire contents of the foregoing are hereby incorporated herein by this reference.

The technique of algorithmically manipulating the errors associated with mismatched unit elements has received much attention recently in the context of multi-bit sigma-delta implementations. See, Nys, "A 19-Bit Low-Power Multi-bit Sigma-Delta ADC Based on Data Weighting", IEEE Journal of Solid State Circuits, Volume 32, No. 7, July 1997. The entire contents of the foregoing disclosure is hereby incorporated herein by reference. In the Nys paper, a data weighted averaging (DWA) is proposed in which thermometer codes are rotated by an amount determined by the previous position of the rotated thermometer code. As such, each rotated thermometer code is data weighted in the sense that the position of the last unit element employed in the previous cycle is remembered, so that the next successive unit element becomes the first unit element to be employed in the next cycle. This DWA algorithm insures that every unit element is utilized as quickly as possible and, over time, that every unit element is used the same number of times. Serendipitously, it has also been determined that the use of a DWA algorithm inherently implements first order noise shaping.

Various theoretical proposals and other "block diagram" implementations have been proposed for algorithmically manipulating unit elements. See, for example, Nys, et al., IEEE Journal of Solid-State Circuits, Vol. 32, No. 7, entitled "A 19-Bit Low-Power Multibit Sigma-Delta ADC Based on Data Weighted Averaging" dated July 1997; Henderson, et al., IEEE Transactions of Circuits and Systems entitled "Dynamic Element Matching Techniques with Arbitrary Noise Shaping Function"; Nys, et al, "An Analysis of Dynamic Element Matching Techniques in Sigma-Data Modulation." IEEE, dated 1996; Lin, et al. entitled "Multi-Bit DAC with Noise-Shaped Element Mismatch"; Galton, IEEE Transactions on Circuits and Systems II: Analog and Digital Signal Processing, entitled "Spectral Shaping of Circuit Errors in Digital-to-Analog Signal Processing, dated Dec. 18, 1995; Schreier, et al., entitled "Noise-Shaped Multi-bit D/A/ Convertor Employing Unit Elements; Baird, et al., IEEE Transactions on Circuits and System—II: Analog and Digital Signal Processing, Vol. 42, No. 12, entitled "Linearity Enhancement of Multibit $\Delta\Sigma$ A/D and D/A Converters Using Data Weighted Averaging", dated December 1995; Adams, et al., U.S. Pat. No. 5,404,142, issued Apr. 4, 1995 entitled "Data-Directed Scrambler for Multi-Bit Noise Shaping D/A Converters"; and Williams, ISSCC 98/Session 4/Oversampling Converters/Paper TP4.1, and entitled "An Audio DAC With 90 dB Linearity using MOS to Metal-Metal Change Transfer". The entire contents of the foregoing are hereby incorporated herein by this reference. However, a practical implementation has not been presented for algorithmically varying mismatched unit elements. Therefore, such an implementation is needed.

SUMMARY OF THE INVENTION

In accordance with a preferred embodiment of the present invention, specific circuit components are proposed for implementing a first order noise shaping apparatus for use in data converters employing thermometer code based DAC elements. In accordance with further aspects of the present invention, mismatched algorithms may be implemented in a first order and higher order noise shaping apparatus in the context of multibit data converters. Moreover, while a preferred embodiment is described in the context of a DAC, the teachings of the present invention may also be applied to ADC's and, indeed, any other application where it is desirable to compensate for mismatched unit elements.

In accordance with an additional aspect of the present invention, a binary addressable "barrel-shifter" is implemented in a pseudo-analog fashion with an array of analog transmission switches that provide low propagation delay and complexity. This barrel-shifter rotates the thermometer code as a function of a characteristic (e.g., magnitude) of the DAC output signal for the previous processing cycle. In accordance with a further aspect of the present invention, the barrel-shifter is implemented using a plurality of two input multiplexors which shift (or rotate) the thermometer code data as a function of the data associated with the previous cycle. In accordance with a further aspect of the present invention, DWA algorithms may be implemented in a manner which uses all of the unit elements at the maximum possible rate while ensuring that each unit element is used the same number of times. In accordance with a further aspect of the present invention, the aforementioned barrel-shifter performs a first order noise shaping function on the mismatch errors while implementing the DWA algorithm.

These and other applications, advances and advantages will become evident to one skilled in the art upon reviewing the non-limiting embodiments described in the specification.

BRIEF DESCRIPTION OF THE DRAWINGS

The subject invention will hereinafter be described in conjunction with the appended drawing figures, wherein like numerals designate like elements, and:

FIGS. 4a and 4b are schematic diagrams of exemplary two-to-one multiplextors (MVX) useful in implementing the barrel-shifter circuit of FIGS. 3a and 3b;

FIGS. 5a and 5b are a block diagram of the barrel-shifter with associated shifts as a result of output signal application to a select line;

DESCRIPTION OF THE PREFERRED EMBODIMENTS

The ensuing descriptions are preferred exemplary embodiments only, and are not intended to limit the scope, applicability, or configuration of the invention in any way. Rather, the ensuing descriptions will provide those skilled in the art with a convenient road map for implementing a preferred embodiment of the invention, it being understood that various changes may be made in the function and arrangement of elements described in the preferred embodiments without departing from the spirit and scope of the invention as set forth in the appended claims.

Figure 1:
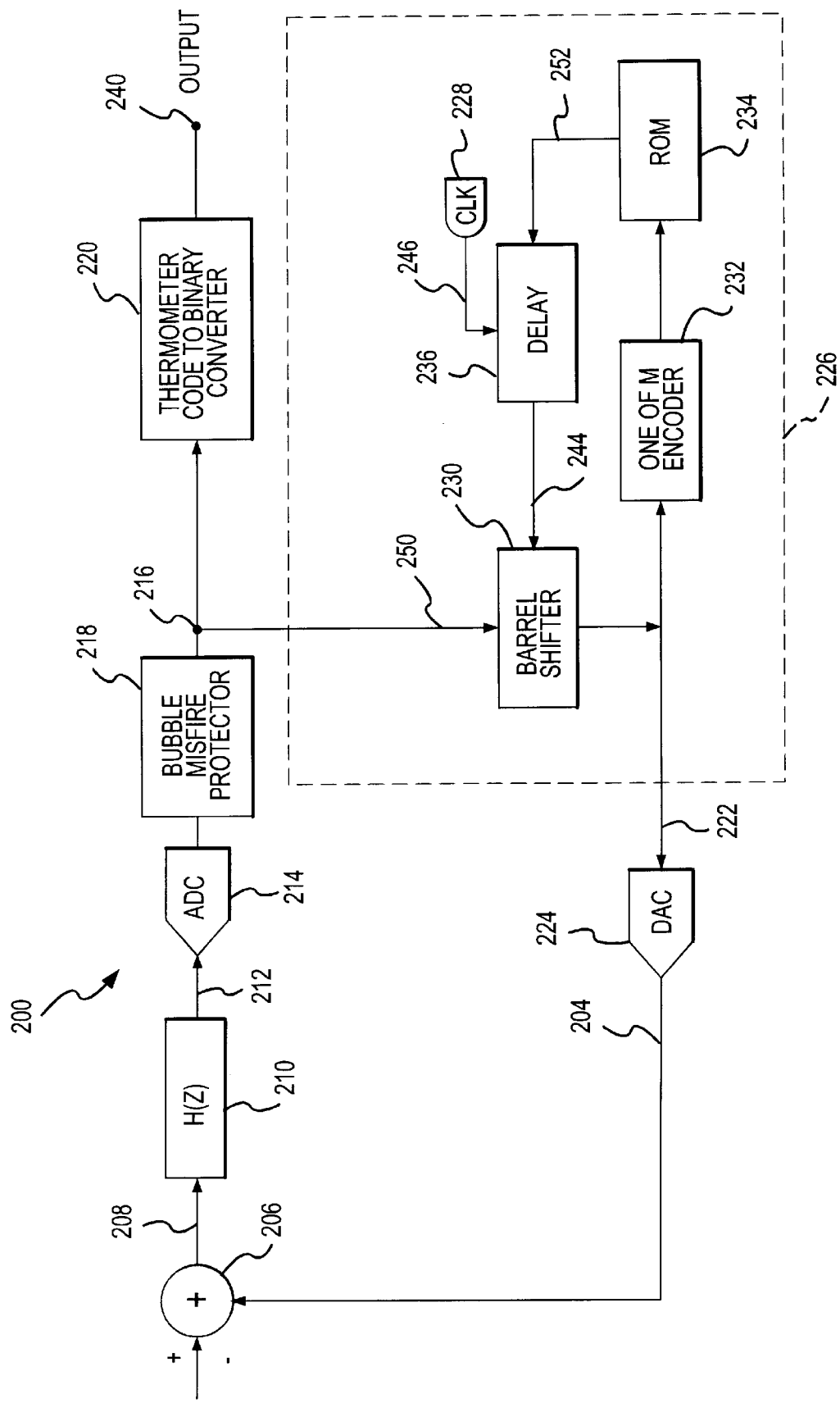
FIG. 1 is a schematic block diagram of the present invention shown in the context of an $n^{th}$ order, multi-bit sigma-delta modulator.

Referring to FIG. 1, a sigma-delta modulation circuit 200 of a preferred embodiment of the present invention is shown that includes a summing junction 206, a filter 210, an ADC 214, a bubble misfire protector 218, a thermometer code-to-binary converter 220, a DAC 224, and a rotator circuit 226.

More particularly, filter 210 suitably performs a noise shaping function on input analog signal 208, whereupon the processed signal 212 is applied to ADC 214 and misfire protector 218. ADC 214 is an N-level multi-bit data converter and misfire protector 218 may be formed as an integral component of the ADC 214, or alternatively as an individual component. In order to compensate for quantization noise imparted to the signal by ADC 214, the output signal 216 is suitably fed back to summing junction 206, wherein the quantization noise is suitably noise shaped out of the analog signal band. However, the unit elements (e.g., capacitors, resistors, current sources, and the like) of the DAC 224 may not necessarily be perfectly matched; consequently, these unit elements may impart an error to the analog signal 204 produced by the DAC 224 and fed to the summing junction 206.

The rotator circuit 226 is employed to rotate the output signal 216, such that a rotated output 222 of the output signal 216 is applied to the DAC 224. In this way, the error associated with the mismatched unit elements may be effectively noise shaped by implementing a suitable noise shaping function (e.g. a first order noise shaping function) as a consequence of a suitable algorithm (e.g., DWA) for manipulating the unit elements. In order to provide this function, a preferred embodiment of the rotator circuit 226 may suitably be configured to include a barrel shifter 230, encoder 232, read-only-memory (ROM) 234, digital delay 236 and clock 238.

With continued reference to FIG. 1, the output signal 216 from the ADC 214 and bubble misfire protector 218 is applied to the thermometer code-to-binary converter 220, which suitably encodes the output signal 216 to produce an encoded output signal 240 which may be subsequently processed, as desired. For example, the encoded output signal 240 may be an n-bit number corresponding to a desired characteristic (e.g., magnitude) of output signal 216. Furthermore, the output signal 216 is suitably fed to the rotating circuit 226 such that the circuit 226 converts the signal 216 to the rotated output 222 that is provided to the DAC 224.

In the embodiment as shown in FIG. 1, the bubble misfire protector 218 is provided to ensure that the raw thermometer code 250 properly represents the processed signal 212 as converted by the ADC 214. This raw thermometer code 250 is then applied to the shifter 230 which also receives a digitally delayed signal 244 from the digital delay 236 that is controlled by a clock signal output 246 from the clock 228; the delayed signal 244 thus essentially corresponds to the output signal 222 delayed by one or more cycles. In a particularly preferred embodiment, the delayed signal 244 suitably represents the binary value of the output signal 216 produced by the ADC 214 as generated by the encoder 232 and ROM 234. In this way, the rotator circuit 226 may suitably manipulate (e.g., rotate) the output signal 216, using the binary value of the signal from the previous cycle as a pointer or "bookmark" useful in implementing the DWA or other algorithm for varying the unit elements within the DAC 218.

Figure 2:
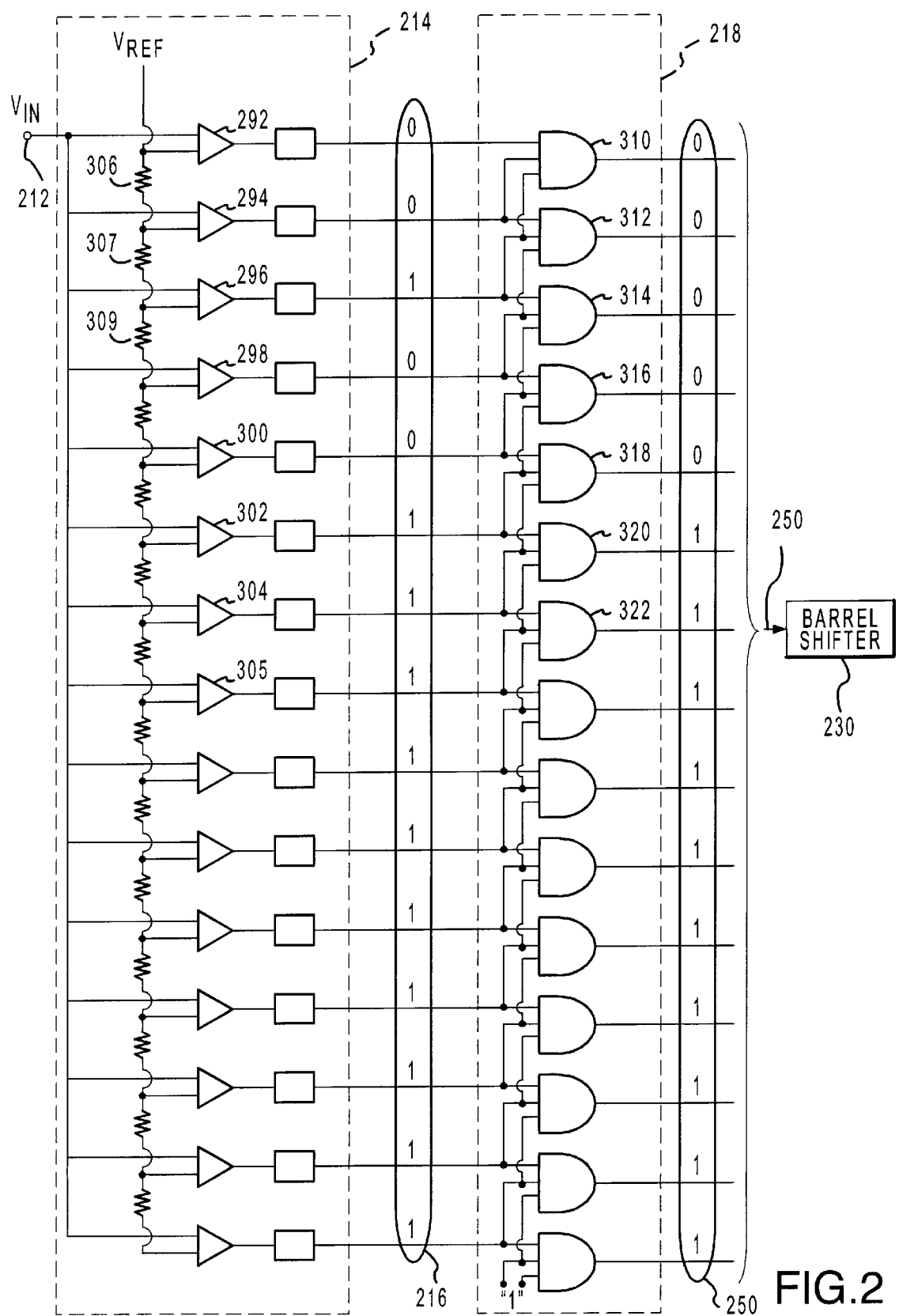
FIG. 2 is a detailed, schematic diagram of an n-level flash ADC and a misfire protector in accordance with a preferred embodiment of the present invention.

Referring now to FIG. 2, the ADC 214 and misfire protector 218 are shown in greater detail. More particularly, an exemplary N-level flash ADC 214 is suitably configured to produce a raw thermometer output 216 which is applied to the misfire protector 218. The ADC 214 suitably comprises a plurality of comparators 302,304,306, etc., each having two inputs. A voltage divider network comprising resistors 305,307,309, etc. connected in series, is suitably employed to divide a voltage reference signal into various levels, each of which is suitably applied to one of the inputs of each of the comparators 302,304,306, etc. In a preferred embodiment, the various voltage levels may be spaced equally, for example by one Least Significant Bit (LSB); alternatively, they may be spaced logarithmically, or any other scheme as desired. The processed signal 212 (i.e., a common analog input voltage) is suitably applied to the other input of each of the comparators 302,304,306, etc.

ADC 214 thus generates the output signal 216 which is an N-bit signal, referred to herein as raw thermometer code. In this regard, the term "thermometer" code is a term of art which relates to the notion that the level of 1's or 0's in raw thermometer code rises up and down in discrete time as a function of the instantaneous value of the analog input signal, much like the mercury level in a classical mercury thermometer rises and falls as a function of temperature. During each processing cycle, a unique transition point from one binary value (e.g., 0) to the other binary value (e.g., 1) is associated with raw thermometer code.

As a particular branch of the ADC 214 may intermittently misfire (for example as shown by the misfired "1" output from compensator 296 in FIG. 2) and produce a logical value which is not representative of the processed signal provided at the voltage input 212 of the ADC 214, the output signal 216 of the ADC 214 is advantageously preprocessed by the misfire protector 218. The misfire protector 218 includes multiple AND gates 310,312,314,316,318,320,322, etc., each having three inputs. One input receives a corresponding branch output of the ADC 214, and the second and third inputs receive the ADC branch outputs from the two preceding branches. In this way, if the three branch outputs presented to an AND gate do not correspond (i.e., all logical "1's"), a misfire for the branch is identified and a corrected output is produced. Ultimately, raw thermometer code 250 with reduced error is generated and presented to the barrel shifter 230 for rotation. It should be noted that this misfire protector 218 is merely exemplary and this error protection may be implemented in a variety of ways.

Figure 3A:
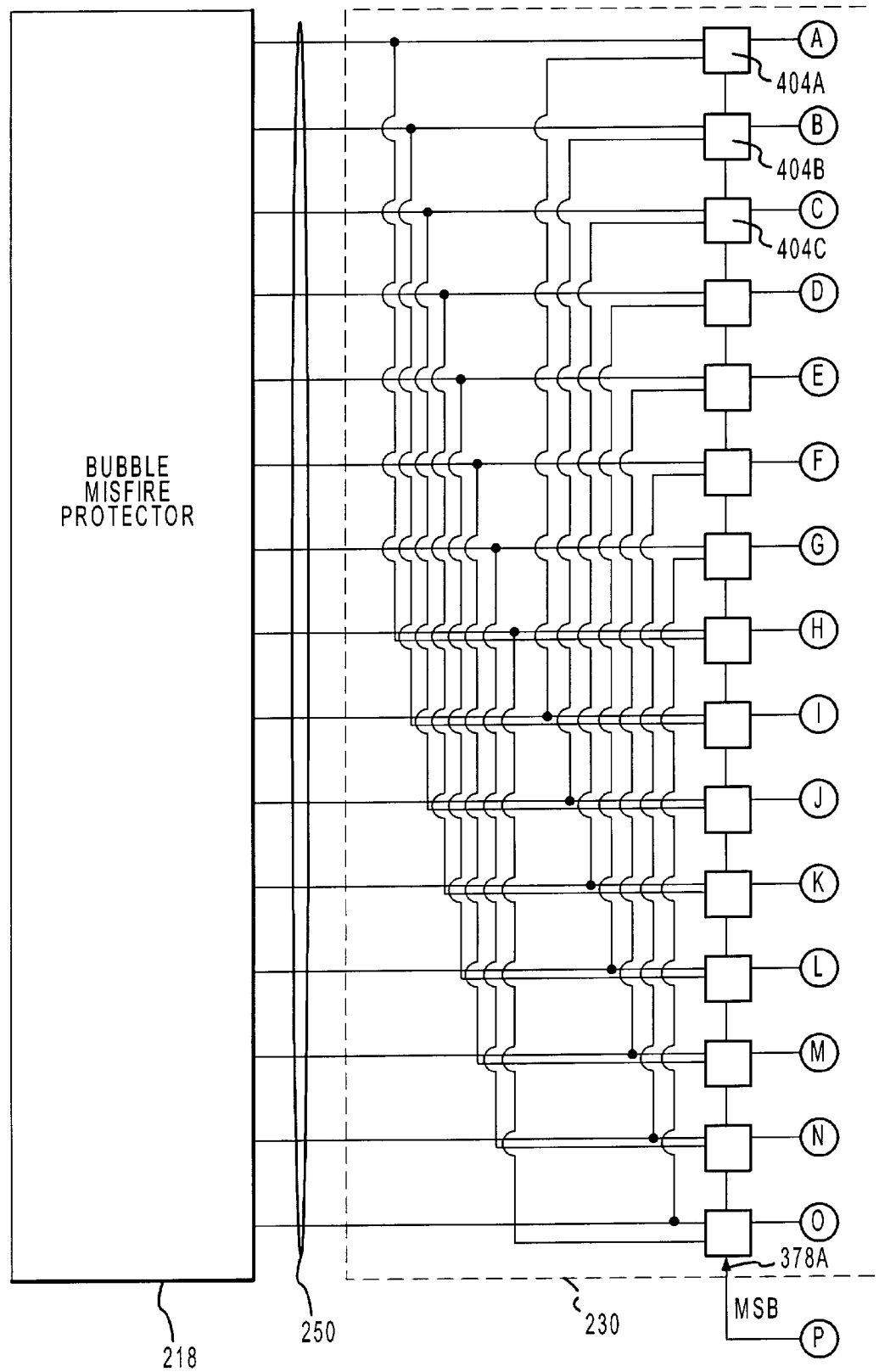
FIGS. 3a and 3b are a detailed, schematic block diagram representation of a barrel-shifter circuit in accordance with a preferred embodiment of the present invention.
Figure 3B:
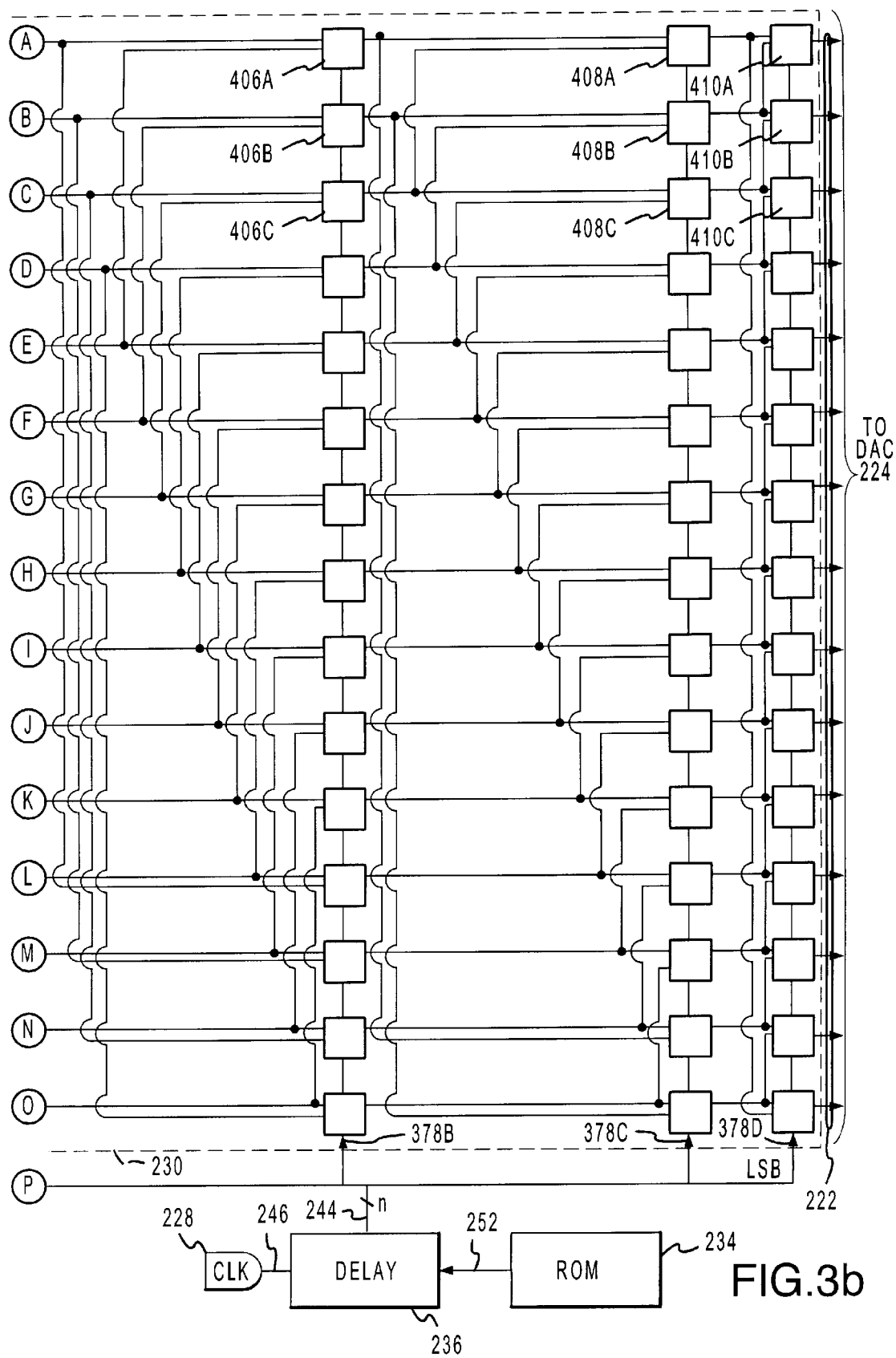

With reference to FIGS. 3a and 3b, the raw thermometer code 250 produced by the bubble misfire protector 218 is applied to the barrel-shifter 230. The raw thermometer code 250 is rotated by the barrel-shifter 230 such that a rotated version of the thermometer code (i.e., rotated output 222) is applied to the DAC 224 in the feedback loop as illustrated in FIG. 1); significantly, in each processing cycle the raw thermometer code 250 is rotated by an amount which is determined by the binary representation of the digital signal of the previous operational cycle. In this manner, various algorithms (e.g., DWA, random number generation, or the like) for manipulating the unit elements within the DAC may be elegantly implemented.

Referring now to FIGS. 3a and 3b, raw thermometer code 250 is applied from the misfire protector 218 to the barrel-shifter 230; barrel-shifter 230 then rotates the raw thermometer code 250 as a function of the delay signal 244 which, in the preferred embodiment, corresponds to a binary signal 252 from ROM 234 in the previous processing cycle, as will be subsequently described in greater detail.

Barrel-shifter 230 suitably comprises one or more columns of shifting units, depending on the number of bits N associated with binary signal 244. In the illustrated embodiment, a 4-bit binary signal 244 is produced by ROM 234; hence, barrel-shifter 230 suitably comprises a first column of shifting units 404, a second column of shifting units 406, and a third column of shifting units 408, and a fourth column of shifting units 410. Column 404 corresponds to the most significant bit (MSB) associated with the 4-bit output signal 244, and column 410 corresponds to the least significant bit (LSB) associated with binary signal 244.

Column 404 suitably comprises a plurality of individual shifting units 404A,404B,404C etc.; columns 406,408,410 are suitably similarly configured. In a particularly preferred embodiment, each of the respective shifting units comprising columns 404–410 suitably comprise a two input multiplexor 500 as shown in FIGS. 4a and/or 4b. While the following description of an exemplary multiplexor 500 will be made with reference to the transmission gate embodiment shown in FIGS. 4a, a wide variety of multiplexor configurations may be utilized, including, but not limited to the logic gate embodiment shown in FIG. 4b.

Referring to FIG. 4a, an exemplary multiplexor 500 suitably comprises a first input 512, a second input 514, respective switches 506 and 508, an inverter 504, and an output line 510. Multiplexor 500 also suitably comprises a select line 502, analogous to one of select lines 378A–378D of FIGS. 3a and 3b. Moreover, second input 514 corresponds to a straight path input from the previous element. In other words, input 514 corresponds to the output 250 from misfire protection circuit 218 for those multiplexors in column 404 (see FIGS. 3a and 3b); input 514 corresponds to the direct path connection from the corresponding multiplexor in the previous column for multiplexors in columns 406–410.

Input 512 on the other hand, corresponds to the input of another (predetermined) multiplexor further down (or up) the same column. For example, for each multiplexor in row 404, input 512 corresponds to another multiplexor in row 404 located eight positions from multiplexor 500. For those multiplexors in row 406, input 512 corresponds to another multiplexor in row 406 which is four positions down from multiplexor 500. For those multiplexors in column 408, input 512 corresponds to another multiplexor in row 408 which is two positions down from multiplexor 500. Finally, for those multiplexors in row 410 input 512 corresponds to the input to the multiplexor immediately below multiplexor 500. In this regard, it will be appreciated that the terms "below", "beneath", and the like are merely exemplary, and that each of respective rows 404–410 is most suitably modeled as a continuous belt, i.e., the bottom most shifting unit would be considered to be "above" the top most shifting unit, and the top most shifting unit would be considered to be immediately "below" the bottom most shifting unit consistent with the "above" and "below" designations employed herein. With continued reference to FIG. 4a, when a "no switch" command (s=0) is applied to select line 502, switch 508 remains closed, allowing the direct path input at 514 to be passed onto output 510. That is, the 0 present on select line 502 is inverted by invertor 504, resulting in a logic level 1 being applied to switch 506, causing switch 506 to remain open, thus preventing the "shifted" value at input 512 from appearing at output 510. However, when a "switch" command (s=1) is applied to select line 502, switch 508 is opened, preventing the direct path input at 514 from appearing at output 510. Rather, the 1 present on select line 502 is inverted by 504 such that a 0 is applied to switch 506, closing the switch and allowing the "rotated" value at input 512 to appear at output 510. In this regard, a DWA algorithm may be implemented as will be subsequently described.

Referring again to FIGS. 3a and 3b, select line 378A suitably corresponds to the most significant bit (MSB) associated with the binary word output from delay 236. Similarly, select line 378B corresponds to the next significant bit in signal 244; select line 378C corresponds to the next significant bit in signal 244; and select line 378D corresponds to the least significant bit (LSB) in signal 244. Select line 378A is suitably applied to each switching unit associated with column 404, namely switching block 404A, 404B,404C, etc. Similarly, select line 378B is suitably applied to each respective switching unit 406A,406B,406C, etc. associated with column 406. Select line 378C is applied to each switching unit 408A,408B,408C, etc. associated with column 408, and select line 378D is suitably applied to each switching unit 410A,410B,410C, etc. associated with column 410.

With continued reference to FIGS. 3a and 3b, recall that each of the N outputs comprising raw thermometer code 250 carry either a 1 or a 0, with raw thermometer code 334 being characterized by one or more 0's at the top and one or more 1's filling out the bottom, depending on the magnitude of the output signal (except, of course, in the case where thermometer code 334 is either all 1's or all 0's). Select line 378A is suitably configured to effect a desired "shift" (i.e., rotation) of the raw thermometer code applied to column 404.

More particularly and with momentary reference to FIGS. 5a and 5b, column 404 may either leave the raw thermometer code intact (FIG. 5a), or it may rotate the raw thermometer code (FIG. 5b), depending on whether a high or low logic level is applied to select line 378A. In this regard, a logic level 0 (s=0) resident on select line 378A corresponds to the no shifting condition shown in FIG. 5a, whereas a high logic level (s=1) on select line 378A corresponds to the shifting condition shown in FIG. 5b. As seen in FIG. 5a, the raw thermometer code 602 input to column 404 remains intact, such that the output code 604 from column 404 remains unchanged. In contrast, when the select line instructs shifter 404 to effect a shift, the raw thermometer input 606 is suitably rotated by a predetermined amount; in FIG. 5b, output signal 608 is rotated eight places with respect to input signal 606.

Thus, referring to FIGS. 3a and 3b, when a "no switch" (s=0) is applied by select line 378A to column 404, the data remains unchanged; when a "switch" command is applied by select line 378A to column 404, the raw thermometer code 250 is rotated by a predetermined number of places. In this regard, although column 404 is illustrated as effecting a shift of eight places, it will be understood that each of respective columns 404–410 may suitably be configured to effect virtually any desired shift, depending on the algorithm being implemented. For clarity, however, column 404 is suitably configured to shift the raw thermometer code 334 by either 0 or $2^3$; column 406 is configured to shift by either 0 or $2^2$; column 408 is configured to shift by either 0 or $2^1$; and column 410 is configured to shift by either 0 or $2^0$.

In view of the forgoing explanation, a 4-bit delayed signal 244 applied to select line 378 results in a rotation of the raw thermometer code 250 as follows: either 0 or eight levels by column 404, depending on whether select line 378A carries a 1 or a 0; the thermometer code is rotated another 0 or four places at column 406 depending on whether a 1 or a 0 is present on select line 378B; the thermometer code data is rotated another 0 or 2 places at column 408 depending on whether select line 378C carries a 0 or a 1; and the code is rotated by another 0 or 1 place at column 410 depending on whether select line 378D carries a 0 or a 1-bit. Thus, for a 4-bit control signal applied to the barrel-shifter at select line 378, the raw thermometer code 250 may be shifted by 0 places, 1 place, 2 places, or up to 15 places. Stated another way, for an n-bit control signal, n columns associated with barrel-shifter 230 may shift the raw thermometer code 250 by any desired amount, from 0 places up to and including/ ($2^n$) places. Significantly, the amount by which barrel-shifter 230 rotates the raw thermometer code may be conveniently determined by the binary value of the data from any prior cycle (e.g., the immediately previous cycle), thereby implementing the DWA algorithm.

Figure 6:
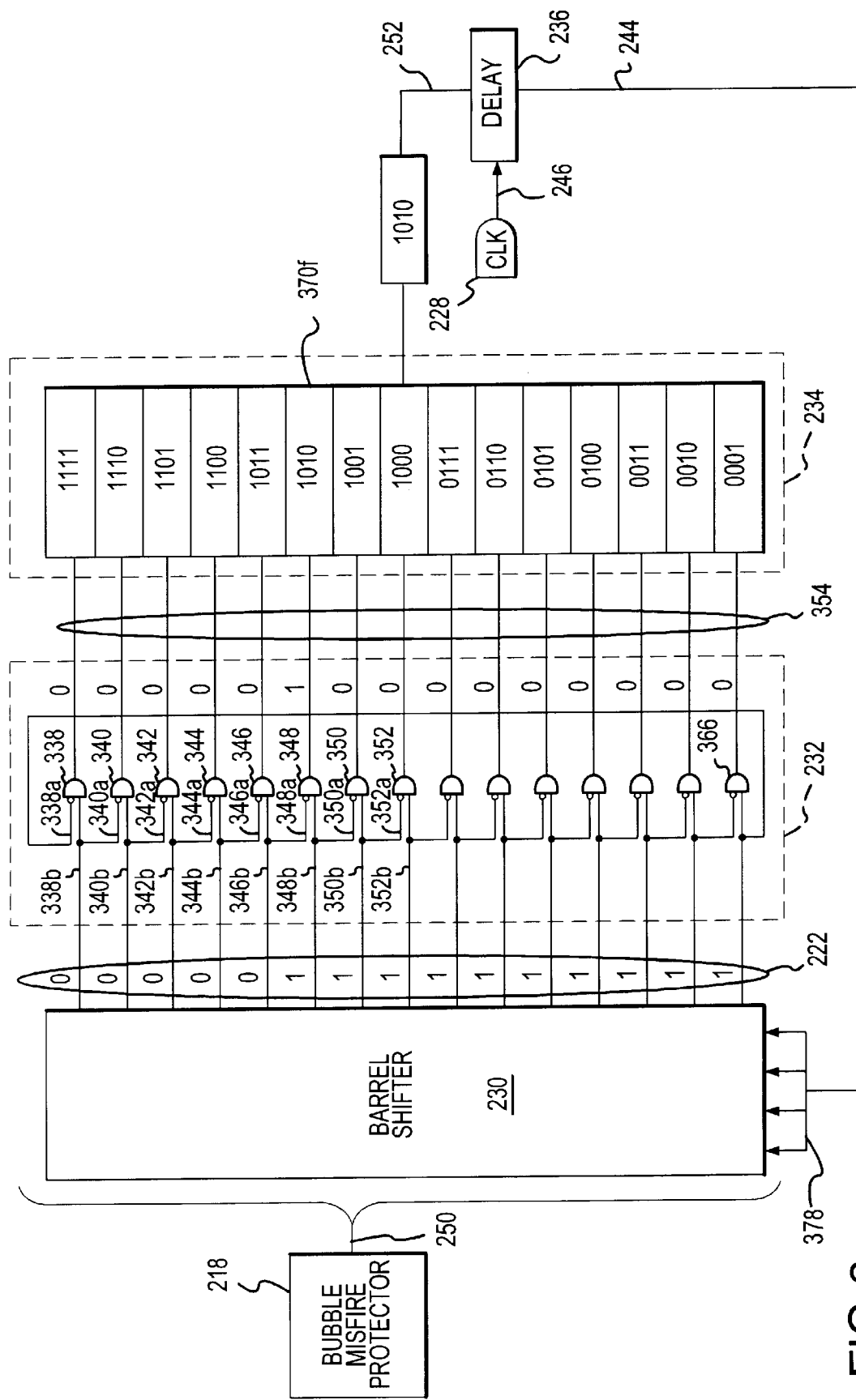
FIG. 6 is a detailed, schematic diagram of the encoder and ROM in accordance with a preferred embodiment of the present invention.

As already described, the rotation of the raw thermometer code is based upon the binary value of the raw thermometer code from the previous cycle. This may be accomplished utilizing the encoder 232 and ROM 234 which are illustratively shown in further detail in FIG. 6. Referring to FIG. 6, the raw thermometer code 250 is advantageously bubble converted by the encoder 232, such that only one of the N outputs of the encoder 232 identifies the logical transition of the raw thermometer code 250, hence, the magnitude of the thermometer code corresponding to the magnitude of the analog signal initially applied to the ADC.

More particularly, encoder 232 suitably comprises a series of cascaded AND gates 338,340,342,344,346,348,350,352, etc., each having an inverted input 338a,340a,342a,344a, 346a,348a,350a,352a, etc. and a non-inverted input 338b, 340b, 342b,344b,346b,348b,350b,352b, etc., respectively. As best seen in FIG. 2, the output from one AND gate 310,312,314,316,318,320,322, etc., associated with each of the ADC 214 comparators 292,294,296,298,300,302,304, etc. is applied to a non-inverted input 338b,340b,342b,344b, 346b,348b,350b,352b, etc. of a corresponding AND gate 338,340,342,344,346,348,350,352, etc., of the encoder 232.

For example, the signal produced by comparator 298 (see FIG. 2) is applied to the non-inverted input terminal 344b of AND gate 344. In addition, this comparator 298 generated signal is applied to the inverted input terminal 346a of AND gate 346. In this way, AND gate 346 suitably outputs a 0, since an inverted 0 (i.e., a 1) is applied to the inverted input terminal 346a and a non-inverted 0 (the signal produced by comparator 298) is applied to the non-inverted input 346b of AND gate 346. At the transition from 0 to 1 in the raw thermometer code 222, it can be seen that an inverted 0 (i.e., 1) is applied to inverted input terminal 348a of AND gate 348, whereas a non-inverted 1 (the signal produced by comparator 302 of FIG. 2) is applied to the non-inverted input 348b of AND gate 348. Since two logical 1's are applied to AND gate 348, a 1 is produced. However, the "transition" 1-bit associated with the raw thermometer code 222, namely the 1-bit output from the comparator 304 (see FIG. 2), is inverted as it is applied to the inverted terminal 350a of AND gate 350, whereas the 1 output from comparator 305 (see FIG. 2) is not inverted as it is applied to AND gate 350 such that a 0 output from AND gate 350 is produced. It can thus be seen that the encoder 232 uniquely identifies the transition from logic high to logic low within the raw thermometer code 222, and thus uniquely identifies the "magnitude" associated with the input analog signal 208. Encoder 232 is therefore referred to as a "1 of N" encoder in that it selects a single AND gate output from N available outputs as identifying the transition point within the raw thermometer code; the encoder output 354 is thus referred to as "bubble corrected thermometer code."

As can be seen in FIG. 6, the encoder output 354 (i.e., bubble corrected thermometer code) is suitably applied to the ROM 234 to thereby select the binary word (e.g., 370f) corresponding to the magnitude of input signal as represented by the bubble corrected thermometer code 354.

Although a 4-bit binary word corresponding to 16 possible levels is illustrated in FIG. 6, it will be understood that the embodiment shown in FIG. 6 is merely exemplary and that virtually any number of voltage levels, bit values, and the like may be accommodated in accordance with the present invention. Moreover, although ROM 234 is illustrated storing a plurality of successive linear increments, the values stored in the ROM 234 may be any suitable value depending upon the particular algorithm being implemented.

Continuing with FIG. 6, the binary value of output 252, which digitally expresses the value of the input analog signal, is provided to the delay register 236 and ultimately to the barrel shifter 230 for rotation as previously described. Therefore, the ADC output is rotated by the barrel shifter and provided to the DAC in order to provide DAC element matching error compensation.

Figure 7:
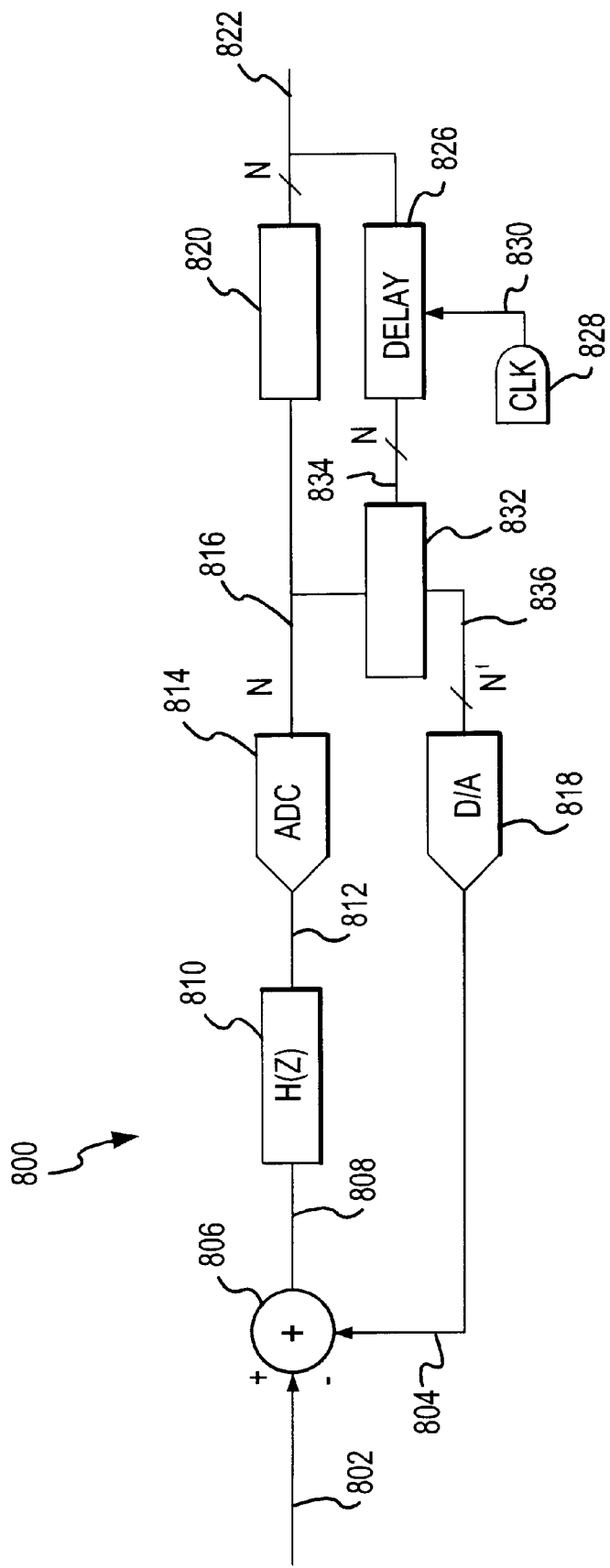
FIG. 7 is a schematic block diagram of an alternate embodiment of the present invention.

Referring to FIG. 7, an alternate implementation of the present invention is suitably illustrated in conjunction with an exemplary delta-sigma modulation circuit 800. The circuit 800 includes a summing junction 806, a filter 810, and ADC 814 that may include a bubble misfire protector, an encoder 820, a delay 826, a clock 830, a DAC 818, and a rotator circuit (i.e., barrel shifter) 832.

As in the foregoing discussion, the rotator circuit 832 is employed to rotate the output signal 816 produced by ADC 214, such that a rotated version 236 of the output from the ADC 214 is applied to the DAC 218. In this way, the error associated with mismatched elements may be effectively noise shaped by implementing a first order noise shaping function as a consequence of a suitable algorithm (e.g., DWA) for manipulating the unit elements, for example. It should be noted that the detailed descriptions of the components of the circuit 800 which were previously presented continue to be applicable. However, by rearranging the components as shown in FIG. 7, DAC element matching error compensation. error compensation and a digital output representing the analog input signal are provided by the circuit.

With continued reference to FIG. 7, the output signal 816 of the ADC 214 is also applied to the encoder 820, which suitably encodes the output signal 816 to produce an encoded output signal 822. For example, as in the previous description of the circuit 200 presented in FIG. 1, the encoded output signal 822 may be an n-bit number corresponding to a desired characteristic (e.g., magnitude) of the input signal 802. The encoded signal 822 is suitably fed back into the rotating circuit 832, such that circuit 832 suitably rotates the output signal 816 of the ADC 214 as a function of the output of the encoder 820. The encoded signal 822 is suitably applied to the rotator circuit 832 through the delay 826 which is controlled by a clock signal 830 from the clock 828, such that delayed signal 834 essentially corresponds to the encoded signal 822 delayed by one or more cycles. The rotator circuit 832 may suitably manipulate (e.g. rotate) the output signal 816 of the ADC 814 signal in order to implement the DWA or other algorithm for varying the unit elements within the DAC 816.

It will be understood that the above description is a preferred exemplary embodiment only, and is not intended to be limiting in any way. Various modifications, substitutions, and other applications of the embodiments discussed herein may be made without departing from the spirit and the scope of the invention as set forth in the appended claims.

What is claimed is:

1. An apparatus for distributing mismatched error associated with a plurality of data converter elements, comprising:

a first plurality of shifting units forming a first shifting column, said first shifting column configured to receive an n-bit binary word;

a first input for each of said first plurality of shifting units, said first input receiving a single bit of said n-bit binary word;

a second input for each of said plurality of shifting units, said second input connected to said first input of another one of said first plurality of shifting units; and a first output for each of said first plurality of shifting units;

a first select line configured to apply a first switch signal to said first plurality of shifting units that results in said plurality of shifting units effectuating a shift of said n-bit binary word received by said first input such that the mismatched error associated with the plurality of data converter elements is distributed; and wherein the first input and second input of each shifting unit are uniquely configured such that each shifting unit receives a unique combination of inputs.

2. The apparatus for distributing mismatched error of claim 1, wherein each of said plurality of shifting units effectuates said shift of said n-bit binary word by producing an output corresponding to said first input when said switch signal is in a first state.

3. The apparatus for distributing mismatched error of claim 2, wherein each of said plurality of shifting units effectuates said shift of said n-bit binary word by producing an output corresponding to said second input when said switch signal is in a second state.

4. The apparatus for distributing mismatched error of claim 1, further comprising:

a second plurality of shifting units forming a second shifting column, said second shifting column configured to receive said n-bit binary word;

a third input for each of said second plurality of shifting units, said third input receiving a single bit of said n-bit binary word from the first output of one of said first plurality of shifting units;

a fourth input for each of said second plurality of shifting units, said fourth input connected to said third input of another one of said second plurality of shifting units; and a second output for each of said second plurality of shifting units;

a second select line configured to apply a second switch signal to said second plurality of shifting units that results in said second plurality of shifting units effectuating a second shift of said n-bit binary word received by said third input; and wherein, the third input and fourth input of each shifting unit are uniquely configured such that each of said second plurality of shifting units receives a unique combination of inputs.

5. The apparatus for distributing mismatched error of claim 4, further comprising:

a third plurality of shifting units forming a third shifting column, said third shifting column configured to receive said n-bit binary word a fifth input for each of said third plurality of shifting units, said fifth input receiving a single bit of said n-bit binary word from the second output of one of said second plurality of shifting units;

a sixth input for each of said third plurality of shifting units, said sixth input connected to said fifth input of another one of said third plurality of shifting units; and a third output for each of said third plurality of shifting units;

a third select line configured to apply a third switch signal to said third plurality of shifting units that results in said third plurality of shifting units effectuating a third shift of said n-bit binary word received by said fifth input; and wherein, the fifth input and sixth input of each shifting unit receive are uniquely configured such that each of said third plurality of shifting units receives a unique combination of inputs.

6. The apparatus for distributing mismatched error of claim 5, further comprising:

a fourth plurality of shifting units forming a fourth shifting column, said fourth shifting column configured to receive said n-bit binary word;

a seventh input for each of said fourth plurality of shifting units, said seventh input receiving a single bit of said n-bit binary word from the third output of one of said third plurality of shifting units;

a eighth input for each of said fourth plurality of shifting units, said eighth input connected to said seventh input of another one of said fourth plurality of shifting units; and a fourth output for each of said fourth plurality of shifting units;

a fourth select line configured to apply a fourth switch signal to said fourth plurality of shifting units that results in said fourth plurality of shifting units effectuating a fourth shift of said n-bit binary word received by said seventh input; and wherein, the seventh input and eighth input of each shifting unit receive are uniquely configured such that each of said fourth plurality of shifting units receives a unique combination of inputs.

7. A method for distributing mismatched error associated with a plurality of data converter elements, comprising the steps of:

(a) forming a first shifting column with a first plurality of shifting units, each of said first plurality of shifting units comprising a first input, a second input, and a first output;

(b) configuring said first shifting column to receive an n-bit binary word;

(c) receiving a single bit of said n-bit binary word with the first input associated with each of said plurality of shifting units;

(d) connecting the second input associated with each of said plurality of shifting units to said first input of another one of said first plurality of shifting units, such that each of said plurality of shifting units has a unique pair of inputs; and (e) applying a first switch signal to said plurality of shifting units that results in said plurality of shifting units effectuating a shift of said n-bit binary word received by said first input such that the mismatched error associated with the plurality of data converter elements is distributed.

8. A method for distributing mismatched error of claim 7, further comprising the step of producing an output with said plurality of shifting units that corresponds to said first input when said switch signal is in a first state.

9. A method for distributing mismatched error of claim 8, further comprising the step of producing an output with said plurality of shifting units that corresponds to said second input when said switch signal is in a second state.

10. A method for distributing mismatched error of claim 7, further comprising the steps of:

(f) forming a second shifting column with a second plurality of shifting units, each of said second plurality of shifting units comprising a third input, a fourth input, and a second output;

(g) configuring said second shifting column to receive said n-bit binary word;

(h) receiving a single bit of said n-bit binary word from the first output of one of said first plurality of shifting units with the third input associated with each of said second plurality of shifting units;

(i) connecting the fourth input associated with each of said plurality of shifting units to said third input of another one of said second plurality of shifting units such that each of said second plurality of shifting units has a unique pair of inputs; and (j) applying a second switch signal to said second plurality of shifting units that results in said second plurality of shifting units effectuating a shift of said n-bit binary word received by said third input.

11. A method for distributing mismatched error of Claim 10, further comprising the steps of:

(k) forming a third shifting column with a third plurality of shifting units, each of said third plurality of shifting units comprising a fifth input, a sixth input, and a third output;

(l) configuring said third shifting column to receive said n-bit binary word;

(m) receiving a single bit of said n-bit binary word from the second output of one of said second plurality of shifting units with a fifth input associated with each of said third plurality of shifting units;

(n) connecting a sixth input associated with each of said third plurality of shifting units to said fifth input of another one of said third plurality of shifting units, such that each of said third plurality of shifting units has a unique pair of inputs; and (o) applying a third switch signal to said third plurality of shifting units that results in said third plurality of shifting units effectuating a shift of said n-bit binary word received by said fifth input.

12. A method for distributing mismatched error of claim 11, further comprising the steps of:

(p) forming a fourth shifting column with a fourth plurality of shifting units, each of said fourth plurality of shifting units comprising a seventh input, a eighth input, and a fourth output;

(q) configuring said fourth shifting column to receive said n-bit binary word;

(r) receiving a single bit of said n-bit binary word from the third output of one of said second plurality of shifting units with a seventh input associated with each of said fourth plurality of shifting units;

(s) connecting a eighth input associated with each of said fourth plurality of shifting units to said seventh input of another one of said fourth plurality of shifting units, such that each of said fourth plurality of shifting units has a unique pair of inputs; and (t) applying a fourth switch signal to said fourth plurality of shifting units that results in said fourth plurality of shifting units effectuating a shift of said n-bit binary word received by said seventh input.

13. A sigma-delta modulation circuit that provides a distribution of mismatched error associated with a plurality of data converter elements, comprising:

a filter configured to perform a noise shaping function on an analog input signal and generate a processed signal;

an analog-to-digital converter configured to produce a thermometer code signal in response to said processed signal;

a thermometer code-to-binary converter for encoding said thermometer code signal and producing an encoded output signal for subsequent processing; and a rotator circuit configured to receive said thermometer code signal, said rotator circuit generating a rotated output of said thermometer code signal that is provided to a digita-to-analog converter that generates an analog signal which is at least partially utilized to produce said analog input signal such that the mismatched error associated with a plurality of data converter elements is at least partially distributed, said rotator circuit including a barrel shifter having:

a plurality of shifting units forming a shifting column, said shifting column configured to receive said thermometer code signal;

a first input for each of said plurality of shifting units, said first input receiving a single bit of said thermometer code signal;

a second input for each of said plurality of shifting units, said second input connected to said first input of another one of said plurality of shifting units; and a select line configured to apply a switch signal to said plurality of shifting units that results in said plurality of shifting units effectuating a shift of said thermometer code signal received by said first input to produce said rotated output.

14. The sigma-delta modulation circuit of claim 13, further comprising a bubble misfire protector, said bubble misfire protector processing said thermometer code signal produced by said analog-to-digital converter to ensure said thermometer code signal accurately represents said processed signal received by said analog-to-digital converter.

15. The sigma-delta modulation circuit of claim 13, wherein said rotator circuit includes an encoder, said encoder receiving said rotated output and producing an encoder output representing the magnitude of said input analog signal.

16. The sigma-delta modulation circuit of claim 15, wherein said rotator circuit includes a memory, said memory producing a n-bit binary word based upon said encoder output.

17. The sigma-delta modulation circuit of claim 16, wherein said rotator circuit includes a delay register receiving said encoder output and producing a delayed encoder output that is transmitted to said barrel shifter for use as said switch signal.

* * * * *